ent Number: 4,972,089
Date of Patent: Nov. 20, 1990

United States Patent [19]
Stevenson

[54] SINGLE PACKAGE ELECTRO-OPTIC TRANSMITTER-RECEIVER

[75] Inventor: David W. Stevenson, Chandler, Ariz.

[73] Assignee: Motorola Inc., Schaumburg, Ill.

[21] Appl. No.: 331,712

[22] Filed: Apr. 3, 1989

[51] Int. Cl.$^5$ .............................................. G02B 27/00
[52] U.S. Cl. .................................... 250/551; 250/216; 250/239
[58] Field of Search ..................... 250/551, 221, 222.1, 250/216, 239; 350/557, 511, 541

[56] References Cited

U.S. PATENT DOCUMENTS

| | | |
|---|---|---|
| 3,842,263 | 10/1974 | Kornrumpf et al. ................. 250/239 |
| 4,309,605 | 1/1982 | Okabe .................................. 250/239 |
| 4,521,681 | 6/1985 | Inaba et al. .......................... 250/205 |
| 4,614,958 | 9/1986 | Mikami et al. ........................ 357/19 |
| 4,794,431 | 12/1988 | Park ..................................... 250/551 |
| 4,808,812 | 2/1989 | Tanaka et al. ....................... 250/216 |
| 4,833,318 | 3/1989 | Yonekura et al. ................... 250/551 |
| 4,851,695 | 7/1989 | Karl-Ulrich ......................... 250/551 |
| 4,880,974 | 11/1989 | Yamakawa .......................... 250/216 |

Primary Examiner—David C. Nelms
Assistant Examiner—Khaled Shami
Attorney, Agent, or Firm—Robert M. Handy

[57] ABSTRACT

An improved electro-optic transmitter-receiver is provided by arranging a variable light source such as an LED and a photosensitive device, such as a phototransistor, on one or more parts of a substantially flat leadframe. Both the variable light source and photosensitive device face outwardly in the same direction approximately perpendicular to the plane of the package leads. A unitary transparent cover extends over the variable light source and the photosensitive device. A lense is provided over the photosensitive device that does not extend over the variable light source. An NPN phototransistor is desirable for the photosensitive device and is mounted on the central device lead substantially centered under the centrally located lense. When an N-substrate LED is used it is conveniently located on another lead to one side of the lense. The LED may also be located on the same lead as the phototransistor, but not under the lense. Wire bonding is conveniently used to connect the devices to form a three terminal electro-optic transmitter-receiver. It is desirable to have a recess extending into the cover between the LED and the phototransistor to reduce transmission of internally back-scattered light therebetween.

12 Claims, 1 Drawing Sheet

SINGLE PACKAGE ELECTRO-OPTIC TRANSMITTER-RECEIVER

FIELD OF THE INVENTION

This invention concerns electro-optic transmitter-receivers and, more particularly, a single package, a series connected semiconductor electro-optic transmitter-receiver in which both emitter and receiver face outwardly through a transparent cover.

BACKGROUND OF THE INVENTION

It is known to package semiconductor optical emitter and receiver devices in a single housing or package for use, among other things, as a combined transmitter-receiver. In a typical application, the emitter is a light emitting semiconductor diode (LED) which emits light when energized. The light from the LED travels through the transparent cover and exits the device package where it may encounter a separate receiver device or an object that returns part of the emitted light back through the transparent cover to the receiver device in the same housing. Phototransistors, photodiodes and photoresistors are well known receiver devices. It is important that the wavelength sensitivity of the receiver device be such that it can reasonably detect the light wavelength emitted by the LED or other optical emitter within the housing. Various electro-optic emitter-receivers are described in Okabe U.S. Pat. No. 4,309,605, Mikami et al. U.S. Pat. No. 4,614,958, and Inaba et al. U.S. Pat. No. 4,521,681, which are incorporated herein by reference.

Prior art devices suffer from a number of disadvantages, such as for example, use of complex and expensive semiconductor devices and/or housings which increase manufacturing cost and/or fail to provide the desired performance.

Accordingly, there is an ongoing need for improved single package, semiconductor emitter-receiver devices, and it is an object of the present invention to provide such.

It is a further object of the present invention to provide an improved single package, semiconductor emitter-receiver device wherein the emitter and receiver are both outward facing and adapted to be mounted on a simple lead frame well suited for automated assembly and low cost.

BRIEF SUMMARY OF THE INVENTION

The foregoing and other objects and advantages are provided by a single package, emitter-receiver device, comprising, a lead means having thereon an outwardly projecting variable light source and an outwardly directed photosensitive device, and a transparent cover means for allowing passage of light located over the photosensitive device and variable light source, wherein the cover means desirably has a convexly curved lense means substantially centrally located over the photosensitive device for collecting light and a flat or concave portion located over the variable light source for transmitting light.

It is important that the photosensitive device and the variable light source and lead means are arranged so that, absent reflection or scattering external to the device, light from the variable light source backscattered within the packages is insufficient to turn on the photosensitive device.

In a first embodiment, the photosensitive device is mounted on a first portion of the lead means and the variable light source is mounted on a second, spaced apart portion of the lead means. It is convenient if the lead means comprises a first portion having thereon the photosensitive device, a second portion having thereon the variable light source and a third portion, wherein the first, second and third portions are spaced apart in a substantially common plane. A first electrical interconnection means desirably extends between the variable light source and the first portion of the lead means and a second electrical interconnection means desirably extends between the third portion of the lead means and the photosensitive device.

In a preferred embodiment, the photosensitive device is a phototransistor having its collector bonded to the first portion of the lead means and its emitter coupled to the third portion of the lead means and the variable light source is an LED having one terminal bonded to the second portion of the lead means and another terminal coupled to the first portion of the lead means. It is desirable that the curved lense means is recessed within the transparent cover means so as to not protrude therefrom. The curved lense means and flat or concave portion of the transparent cover means are desirably unitary.

In a second embodiment, the photosensitive device is mounted on a first portion of the lead means and the variable light source is mounted on the same portion of the lead means, but spaced-apart from the photosensitive device.

The foregoing summary of the invention and the objects and advantages thereof will be better understood in view of the accompanying drawings and description that follows.

DETAILED DESCRIPTION OF THE DRAWINGS

Figure 1:
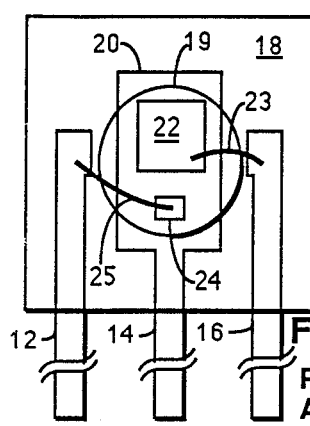
FIG. 1 is a simplified top view of a single package semiconductor emitter-receiver according to the prior art.
Figure 2:
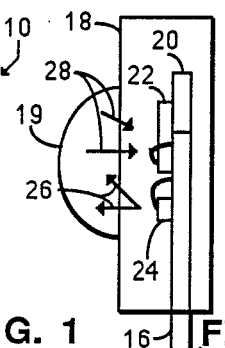
FIG. 2 is a side view of the device of FIG. 1.

FIG. 1 is a simplified top view and FIG. 2 a simplified side view of single package semiconductor emitter-receiver 10 according to the prior art. Emitter-receiver 10 comprises leads 12, 14, 16 enclosed within cover 18. Central lead 14 has die bond portion 20 on which are mounted phototransistor 22 and LED 24. Wirebond 23 connects phototransistor 22 to lead 16 and wirebond 25 connects LED 24 to lead 12. Cover 18 has protruding transparent convex lense 19 located over both phototransistor 22 and LED 24. In this fashion, light 26 emitted by LED 24 and light 28 received by phototransistor 22 pass through lense 19. GaAs LED's are suitable for use in connection with silicon receivers, as for example silicon based phototransistors. Such devices are well known in the art and means for assembling such are also well known.

Figure 3:
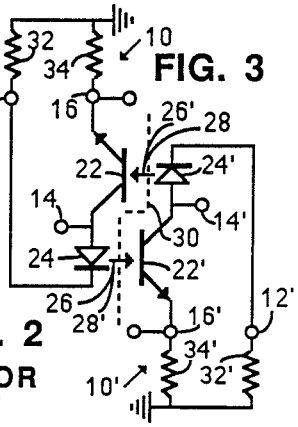
FIG. 3 is a schematic diagram of the electrical circuit associated with a pair of devices according to FIG. 1, arranged face-to-face.

FIG. 3 shows a circuit diagram in which a pair of identical prior art devices 10, 10' of FIGS. 1-2 comprising transistors 22, 22' and LED's 24, 24', are arranged emitter to receiver across gap 30. LED current limiting resistors 32, 32' and output resistors 34, 34' are provided. Power is applied between leads 16, 16' and ground. There need not be any common electrical connection between circuits 10, 10', only the optical connection across gap 30.

A difficulty associated with the arrangement of FIGS. 1-2, is that both the LED and phototransistor are located in close proximity so as to be under the same lense. This increases the likelihood of crosstalk, i.e., light from LED 24 unintentionally reaching phototransistor 22 through internal backscattering within the package. When this is the case, the signaling arrangement shown schematically in FIG. 3 cannot run in a duplex mode, i.e., devices 10 and 10' transmitting and receiving simultaneously, but must run only in a simplex mode, i.e., device 10 transmitting and device 10' receiving or vice versa, but not both at the same time.

A further difficulty with the device of FIGS. 1-2 is that, where an NPN phototransistor is desired to be used, then a P-substrate LED must be provided so that the LED can be arranged in the correct electrical direction on common bonding portion 20. P-substrate LED's are often less desirable than N-substrate LED's because of their higher cost.

Figure 4:
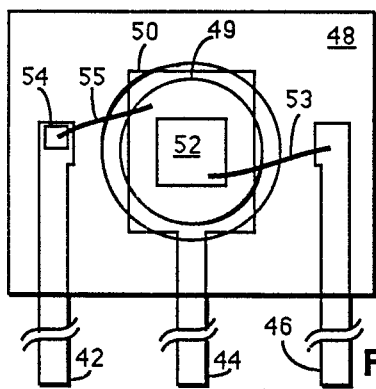
FIG. 4 is a simplified top view of a single package semiconductor emitter-receiver according to a first embodiment of the present invention.
Figure 5:
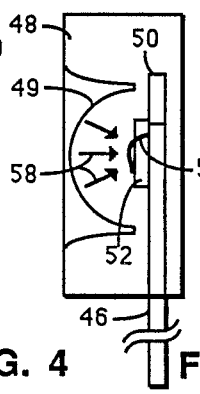
FIG. 5 is a side view of the device of FIG. 4.
Figure 6:
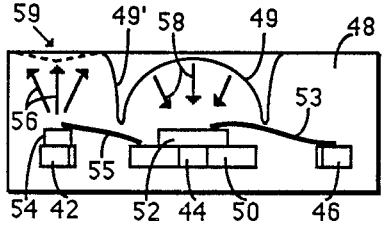
FIG. 6 is a front view of the device of FIG. 4.

The foregoing and other problems are overcome by the invented structure illustrated in a first embodiment in FIGS. 4-6. FIGS. 4-6 show, respectively, a simplified top view, side view, and front view of single package semiconductor emitter-receiver 40 according to the present invention. Emitter-receiver 40 comprises leads 42, 44, 46 enclosed within cover 48. Central lead 44 has die bond portion 50 on which is mounted phototransistor 52 so that, for example, the collector thereof is in electrical contact with lead 44. LED 54 is mounted on lead 42 so that, for example, the anode of LED 54 is in electrical contact with lead 42. Wirebond 53 connects, for example, the emitter of phototransistor 52 to lead 46 and wirebond 55 connects, for example, the anode of LED 54 to lead 44.

Transparent cover 48 has convex lense 49 centrally located over phototransistor 52 but not over LED 54. Light 58 received by phototransistor 52 passes centrally through lense 49, but light 56 emitted by LED 54 does not. This provides improved light collection efficiency for phototransistor 52 as compared to the prior art arrangement of FIGS. 1-2 in which phototransistor 22 is not centrally located under lense 19, but is located to one side in order to leave space for LED 24 which shares lense 19. Lense 49 may protrude in a fashion analogous to lense 19 of FIGS. 1-2. However, the recessed arrangement of lense 49 shown in FIGS. 4-6 is preferred since it makes lense 49 less susceptible to surface damage which adversely affects device performance. For example, surface scratches on protruding lense 19 of FIGS. 1-2 can significantly increase the amount of internal light backscattering.

While a convex lense may also be provided over LED 54, in a preferred embodiment, light 56 from LED 54 passes through substantially flat or concave (dotted) surface portion 59 of transparent cover 48. The preferred structure is particularly simple to manufacture and has been found to give improved results compared to the prior art device of FIGS. 1-2. With surface portion 59 of cover 48 above LED 54 substantially flat, broader external light dispersion was obtained. Also, the arrangement of FIGS. 4-6 is less susceptible to internal light backscatter from LED 54 affecting transistor 52. This is because, among other things, surface portion 49' of lense 49 extending into body 48 acts as a built-in optical separator that impedes transmission of internally scattered light from LED 42 to transistor 52, such as for example, light that is back-scattered from the body-air interface at surface portion 59.

Figure 7:
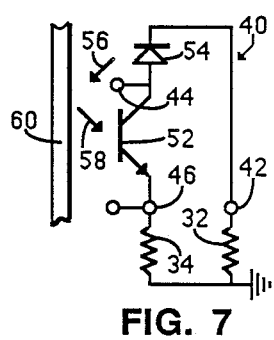
FIG. 7 is a schematic diagram of the electrical circuit associated with the device of FIG. 4.

The above-described features combine to give improved performance in a variety of applications. For example, when a pair of devices of the present invention are arranged as in FIG. 3, they are less sensitive to the emitter-receiver alignment on either side of gap 30. When used singly, as is illustrated for example by the schematic diagram of FIG. 7, light 56 from LED 54 is directed toward object 60, and light 58 is reflected from or scattered by object 60 back toward phototransistor 52. The wider dispersion angle of emitted light combined with the improved light collection efficiency of lense 49 above phototransistor 52 provides higher performance in this situation as well. In particular, the placement of object 60 with respect to emitter-receiver 40 is less critical and a greater on-off signal ratio is obtained from transistor 52 for the same exitation level on LED 54, as object 60 is inserted or removed from the path of emitted light 56. Among other things, this is because the invented arrangement of FIGS. 4-6 has lower levels of internal light backscattering than the prior art arrangement of FIGS. 1-2. Other things being equal, this means that the dark signal level from transistor 52 (no external reflection or scattering) is lower than is obtained with the prior art arrangement.

Figure 10:
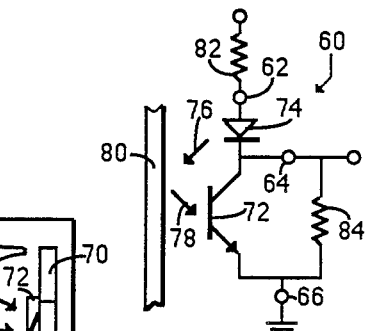
FIG. 10 is a schematic diagram of the electrical circuit associated with the device of FIG. 9.
Figure 8:
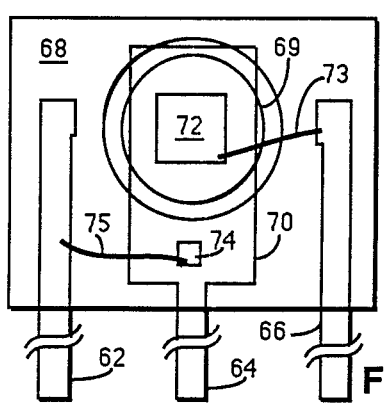
FIG. 8 is a simplified top view of a single package semiconductor emitter-receiver according to a further embodiment of the present invention.
Figure 9:
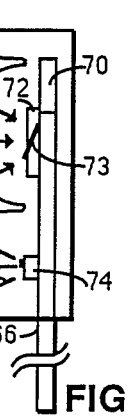
FIG. 9 is a side view of the device of FIG. 8.

A further embodiment of the present invention is illustrated in FIGS. 8-10. FIGS. 8-9 show, respectively, a simplified top view and side view of single package semiconductor emitter-receiver 60 and FIG. 10 shows a simplified schematic diagram applicable to the device of FIGS. 8-9.

Emitter-receiver 60 comprises leads 62, 64, 66 enclosed within cover 68. Central lead 64 has die bond portion 70 on which is mounted phototransistor 72 so that, for example, the collector thereof is in electrical contact with lead 64. LED 74 is mounted elsewhere on die bond portion 70 or elsewhere on lead 64 so that, for example, the cathode of LED 74 is in electrical contact with lead 64. Wirebond 73 connects, for example, the emitter of phototransistor 72 to lead 66 and wirebond 75 connects, for example, the anode of LED 74 to lead 62.

Transparent cover 68 has convex lense 69 centrally located over phototransistor 72 but not over LED 74. Light 78 received by phototransistor 72 passes centrally through lense 69, but light 76 emitted by LED 74 does not. While a convex lense may also be provided over LED 74, in a preferred embodiment, light 76 from LED 74 passes through substantially flat or concave (dotted) portion 79 of transparent cover 68. This arrangement has the advantages already described in connection with FIGS. 4-6, including recessed surface portion 69' between LED 74 and phototransistor 72.

FIG. 10 illustrates how the device of FIGS. 8–9 may be connected to resistors 82, 84. Light 76 from LED 74 is reflected or scattered as light 78 from object 80 back to phototransistor 72 when object 80 is in the path of light 76. Otherwise there is substantially no optical path between LED 74 and transistor 72.

A feature of the arrangement of FIG. 10 is that it is regenerative, that is, as the impedance of phototransistor 72 decreases in response to receiving reflected or scattered light 58, the current through LED 74 also increases causing an increase in emitted light 76. Other things being equal, this increase in emitted light 76 increases received light 78, further reducing the impedance of transistor 72. This regenerative action continues until phototransistor 72 is in saturation where it will remain until object 80 is removed or the light path otherwise interrupted so that the reflected or scattered light drops below the level necessary to sustain conduction in transistor 72. The circuit then shuts off. This circuit has the advantage of a snap-action due to the regeneration and a larger on-off signal ratio that would be obtainable without the regenerative feedback.

Those of skill in the art will appreciate that the substantially flat leadframe employed in the preferred implementation of the present invention is easy to manufacture by means well known in the art and is easy to handle in assembly, as compared to other types of leadframes commonly employed with optoelectronic components. Both the LED and the phototransistor are mounted on flat portions of the leadframe which lie substantially in the same plane. Although various parts of the leadframe might be down-formed or up-formed, this is not necessary. Further the LED and phototransistor are conveniently in the form of die having one contact which is made to the surface on which they are mounted and which are attached to the leadframe by means well known in the art. It is not necessary to use insulators on the leadframe to isolate either the LED or the phototransistor therefrom. Additionally, the simple, back-contact die and planar leadframe of the preferred embodiment of the present invention is especially well suited for low cost automated assembly. Hence the invented product may be produced particularly economically.

Having thus described the invention, those of skill in the art will appreciate that it provides an improved single package, semiconductor emitter-receiver device, and in particular, one in which the emitter and receiver are both outward facing and adapted to be mounted on a simple planar lead frame, and which is well suited for assembly at low cost.

Those of skill in the art will understand, based on the description herein, that many variations may be made in choice of receiver and emitter components without departing from the present invention. For example, while the present invention has been described in terms of silicon phototransistors, those of skill in the art will appreciate that photodiodes and/or photoresister and/or photothyristors or other photosensitive components made from many different materials could equally well be used. Similarly, while the invention has been described in terms of light emitting diodes, as for example GaAs LED's, other emitters and other emitting materials could equally well be used. Those of skill in the art will understand, based on the description herein, how to choose appropriate components for emitters and receivers for use in connection with the present invention.

I claim:

1. An electro-optic device for emitting light to the surrounding atmosphere and receiving light from the surrounding atmosphere and having an outer surface through which the light is emitted and received, comprising:
   metal head means having a principal surface oriented facing the outer surface;
   an LED die bonded by a lower face thereof to a first portion of the principal surface so as to outwardly project light through the outer surface, and separated from the outer surface by a first space;
   a photosensitive device die bonded by a lower face thereof to a second portion of the principal surface so as to inwardly receive light through the outer surface, and separated from the outer surface by a second space; and
   a unitary optically transparent body filling the spaces between the outer surface and the upper faces of the die, wherein the body has a convex-outward curved surface portion in the outer surface over the photosensitive device die and a substantially flat or concave-inward curved surface portion over the LED die.

2. The device of claim 1 wherein the photosensitive device die is mounted on a first portion of the principal surface and the LED die is mounted on a second portion of the principal surface not touching the first portion.

3. The device of claim 2 wherein the lead means comprises first, second and third spaced-apart, electrically isolated leads and the photosensitive device die is a phototransistor having its collector bonded to the first lead and its emitter electrically coupled to a third lead and the LED die has one terminal bonded to the second lead and another terminal electrically coupled to the first lead.

4. The device of claim 1 wherein a recess extends into the transparent body from the outer surface between the die at least half the distance from the outer surface to the principal surface.

5. An electro-optic device for transmitting and receiving light through an outer surface thereof, comprising:
   a metal support having a surface facing and separated from the outer surface by a space;
   a variable light source die mounted on a first portion of the support surface and oriented to project light toward the outer surface;
   a photosensitive device die mounted on another portion of the support surface and oriented to receive light entering the outer surface without receiving significant light directly from the variable light within the device; and
   unitary light transmitting means filling the space between the outer surface and the support surface and upper surfaces of the die without voids and having a convex lense portion in the outer surface over the photosensitive device die and a non-convex portion in the outer surface over the variable light source die.

6. The device of claim 5 wherein the photosensitive device die is mounted on a first portion of the support surface and the variable light source die is mounted on a second portion of the support surface not touching the first portion.

7. The device of claim 6 wherein the lead means comprises first, second and third spaced-apart, electrically isolated leads and the photosensitive device die is a phototransistor having its collector bonded to the first lead and its emitter electrically coupled to a third lead and the variable light source die has one terminal bonded to the second lead and another terminal electrically coupled to the first lead.

8. The device of claim 5 wherein the unitary light transmitting means comprises a recess inwardly extending from the outer surface toward the support surface between the die, wherein sidewalls of the recess are convexly curved in a direction away from the outer surface.

9. A method for forming an electro-optic device for transmitting and receiving light through an outer surface thereof, comprising:
   providing a metal leadframe having first, second and third electrodes separated form the outer surface by a space;
   in either order, bonding a lower surface of a photosensitive semiconductor die on the first electrode, and bonding a lower surface of a light emitting die on the first or second electrode; and
   providing a unitary transparent body filling the space between the outer surface and the leadframe and enclosing upper surfaces of the die without voids and having a first convex portion in the outer surface over the photosensitive die and a second nonconvex portion in the outer surface over the light emitting die.

10. The method of claim 9 wherein the providing and bonding steps comprise, providing a metal leadframe having first, second and third spaced-apart, electrically isolated leads and, in either order, bonding a photosensitive transistor by its collector to the first lead and electrically coupling its emitter to a third lead and bonding the light emitting die to the second lead and electrically coupling another terminal thereof to the first lead.

11. The method of claim 9 wherein the second providing step comprises providing a unitary transparent body having a recess extending from the outer surface more than half-way toward the leadframe and located between the photosensitive die and the light emitting die.

12. The method of claim 9 wherein the second providing step comprises providing a unitary transparent body having a recess between the photosensitive die and the light emitting die, wherein sidewalls of the recess are convex in a direction outward from the outer surface.

* * * * *